US012129412B2

(12) United States Patent
Chae et al.

(10) Patent No.: US 12,129,412 B2
(45) Date of Patent: Oct. 29, 2024

(54) CURABLE SILICONE COMPOSITION AND CURED PRODUCT THEREOF

(71) Applicant: DOW SILICONES CORPORATION, Midland, MI (US)

(72) Inventors: Jung Hye Chae, Midland, MI (US); Myun Hwa Chung, Midland, MI (US); Eun Kyung Jang, Midland, MI (US)

(73) Assignee: DOW SILICONES CORPORATION, Midland, MI (US)

( * ) Notice: Subject to any disclaimer, the term of this patent is extended or adjusted under 35 U.S.C. 154(b) by 889 days.

(21) Appl. No.: 16/979,845

(22) PCT Filed: Mar. 11, 2019

(86) PCT No.: PCT/US2019/021610
§ 371 (c)(1),
(2) Date: Sep. 10, 2020

(87) PCT Pub. No.: WO2019/177969
PCT Pub. Date: Sep. 19, 2019

(65) Prior Publication Data
US 2021/0054265 A1  Feb. 25, 2021

Related U.S. Application Data

(60) Provisional application No. 62/641,671, filed on Mar. 12, 2018.

(51) Int. Cl.
| | | |
|---|---|---|
| *C09K 11/02* | (2006.01) |
| *B82Y 20/00* | (2011.01) |
| *C08G 77/00* | (2006.01) |
| *C08G 77/06* | (2006.01) |
| *C08G 77/20* | (2006.01) |
| *C08L 83/04* | (2006.01) |
| *C08L 83/14* | (2006.01) |
| *C09D 5/22* | (2006.01) |
| *C09D 7/62* | (2018.01) |
| *C09D 183/04* | (2006.01) |
| *C09J 11/04* | (2006.01) |
| *C09J 183/04* | (2006.01) |
| *C09K 11/62* | (2006.01) |
| *C09K 11/88* | (2006.01) |
| *H01L 33/50* | (2010.01) |
| *H01L 33/56* | (2010.01) |

(52) U.S. Cl.
CPC .............. *C09K 11/02* (2013.01); *C08G 77/06* (2013.01); *C08L 83/04* (2013.01); *C08L 83/14* (2013.01); *C09D 5/22* (2013.01); *C09D 7/62* (2018.01); *C09D 183/04* (2013.01); *C09J 11/04* (2013.01); *C09J 183/04* (2013.01); *C09K 11/623* (2013.01); *C09K 11/883* (2013.01); *H01L 33/502* (2013.01); *H01L 33/56* (2013.01); *B82Y 20/00* (2013.01); *C08G 77/20* (2013.01); *C08G 77/80* (2013.01); *C08L 2205/025* (2013.01)

(58) Field of Classification Search
CPC ..... C09K 11/02; C09K 11/623; C09K 11/883; C08L 83/14; C08L 83/04; C08L 2205/025; C08G 77/50; C08G 77/06; C08G 77/20; C08G 77/80; H01L 33/502; H01L 33/56; C09D 5/22; C09J 1/04; C09J 183/04
See application file for complete search history.

(56) References Cited

U.S. PATENT DOCUMENTS

| | | | |
|---|---|---|---|
| 2007/0034833 A1* | 2/2007 | Parce | C01B 19/007 252/301.36 |
| 2007/0112147 A1 | 5/2007 | Morita et al. | |
| 2008/0220593 A1* | 9/2008 | Pickett | C30B 7/00 257/618 |
| 2009/0146175 A1* | 6/2009 | Bahadur | C08L 83/04 257/E33.059 |
| 2010/0110728 A1* | 5/2010 | Dubrow | G02B 1/10 252/301.36 |
| 2010/0113813 A1* | 5/2010 | Pickett | C09C 3/08 977/774 |
| 2014/0332723 A1* | 11/2014 | Kurtin | C08K 9/10 252/301.36 |
| 2015/0152323 A1* | 6/2015 | Delaat | F21V 9/32 252/301.36 |
| 2015/0267106 A1 | 9/2015 | Pillay Narrainen et al. | |
| 2015/0284627 A1 | 10/2015 | Bohmer et al. | |
| 2016/0254425 A1 | 9/2016 | Chung et al. | |
| 2018/0230172 A1 | 8/2018 | Furukawa et al. | |
| 2019/0088838 A1 | 3/2019 | Domann et al. | |

FOREIGN PATENT DOCUMENTS

| | | |
|---|---|---|
| CN | 101389695 A | 3/2009 |
| CN | 102690520 A | 9/2012 |

(Continued)

OTHER PUBLICATIONS

International Search Report for PCT/US2019/021610 dated Jun. 20, 2019, 3 pages.

*Primary Examiner* — C Melissa Koslow
(74) *Attorney, Agent, or Firm* — Warner Norcross + Judd LLP

(57) ABSTRACT

A curable silicone composition is provided. The curable silicone composition comprises a cadmium-free quantum dot in an amount of from about 0.01 to about 10 mass % of the composition, wherein the composition can be cured by a hydrosilylation reaction and has at least about 10 mol % of aryl groups in all silicon atom-bonded organic groups. The curable silicone composition exhibits excellent dispersibility of the quantum dot, and cures to form a cured product exhibiting excellent color conversion efficiency.

6 Claims, No Drawings

(56) References Cited

FOREIGN PATENT DOCUMENTS

| | | | |
|---|---|---|---|
| CN | 104119679 | * | 10/2014 |
| CN | 104119679 A | | 10/2014 |
| CN | 105917479 A | | 8/2016 |
| CN | 106189251 A | | 12/2016 |
| CN | 106867259 A | | 6/2017 |
| JP | 2010126596 A | | 6/2010 |
| KR | 1020140147775 A | | 12/2014 |
| KR | 1020170085058 A | | 7/2017 |
| TW | 201512211 A | | 4/2015 |
| WO | 2007100445 A2 | | 9/2007 |
| WO | WO 2007/100445 | * | 9/2007 |
| WO | WO 2016154214 | * | 9/2016 |
| WO | 2017157743 A1 | | 9/2017 |

* cited by examiner

CURABLE SILICONE COMPOSITION AND CURED PRODUCT THEREOF

CROSS-REFERENCE TO RELATED APPLICATIONS

This application is the National Stage of International Appl. No. PCT/US2019/021610 filed on 11 Mar. 2019, which claims priority to and all advantages of U.S. Provisional Patent Appl. No. 62/641,671 filed on 12 Mar. 2018, the content of which is hereby incorporated by reference.

Technical Field

The present invention relates to a curable silicone composition comprising a quantum dot, and a cured product thereof.

Background Art

Light-emitting diodes (LEDs) are important in lighting materials such as automobile lights, traffic signals, general lighting, liquid crystal display (LCD) backlighting and display screens. Currently, LED devices are typically made from inorganic solid-state compound semiconductors, such as AlGaAs (red), AlGaInP (orange-yellow-green), and AlGaInN (green-blue). However, using a mixture of the available solid-state compound semiconductors, solid-state LEDs that emit white light cannot be produced. Therefore, current a method of color mixing to produce a required color, including white, is to use a combination of phosphors that are placed on top of the solid-state LED whereby the light from the LED is absorbed by the phosphors and then re-emitted at a different frequency. White LEDs can also be made by combining a blue LED with a yellow phosphor; however, color control and color rendering may be poor when using this methodology due to lack of tune-ability of the LEDs and the phosphors.

There has been substantial interest in exploiting the properties of compound semiconductors consisting of particles with dimensions on the order of from 2 to 50 nm, often referred to as quantum dots (QDs). Rudimentary, quantum dot-based, light-emitting devices have been made by embedding colloidally produced quantum dots in an optically clear LED encapsulation medium, typically a silicone or an acrylate, which is then placed on top of a solid-state LED (see Patent Documents 1 and 2). The use of quantum dots potentially has certain significant advantages over the use of the more conventional phosphors, such as the ability to tune the emission wavelength, strong absorption properties, and low scattering.

It will be appreciated from the foregoing discussion that many of the quantum dots that have been extensively studied to date incorporate cadmium ions. There are, however, many environmental problems associated with the use of cadmium and other heavy metals such as mercury- and lead-based materials and thus there is a need to develop cadmium-free quantum dots. In particular, it is desirable to produce cadmium-free quantum dots that exhibit similar monodispersities and size tune-able photo-luminescent spectra to current cadmium based quantum dots.

Hydrosilylation-curable silicone compositions form cured products having excellent characteristics such as weather resistance and heat resistance, and they cure particularly quickly by heating, without producing by-products at the time of curing. Such compositions are used as adhesives, sealing agents, or coating agents for electric/electronic devices.

Curable silicone compositions are used by blending a cadmium-free quantum dot to convert the emission wavelength from the LED. However, because of poor dispersibility of the quantum dot, the quantum dot aggregates, thereby causing a problem in that color conversion efficient of the LED becomes uneven.

PRIOR ART DOCUMENTS

Patent Documents

Patent Document 1: Chinese Patent Application Publication No. 104119679 A
Patent Document 2: Korean Patent Application Publication No. 10-2017-0085058 A1

BRIEF SUMMARY OF INVENTION

Technical Problem

An object of the present invention is to provide a curable silicone composition that exhibits excellent dispersibility of a quantum dot and that cures to form a cured product that exhibits excellent color conversion efficiency. Another object of the present invention is to provide a cured product that exhibits excellent dispersibility of a quantum dot and excellent color conversion efficiency.

Solution to Problem

The curable silicone composition of the present invention comprises a cadmium-free quantum dot in an amount of from about 0.01 to about 10 mass % of the composition, wherein the composition can be cured by a hydrosilylation reaction and has at least about 10 mol % of aryl groups in all silicon atom-bonded organic groups.

The quantum dot may comprise a material selected from the group consisting of ZnS, ZnSe, ZnTe, InP, InAs, InSb, AlP, $Al_2S_3$, AlAs, AlSb, GaN, GaP, GaAs, GaSb, PbS, PbSe, Si, Ge, and combinations thereof. In further embodiments the quantum dot may be selected from nanoparticles comprising cores of one of these materials and one or more shells of another of these materials. Alternatively or in addition, the quantum dot may comprise a core of one of these materials and a shell of a different material altogether, or a core of a different material altogether and at least one shell comprising at least one of these materials.

In various embodiments, the curable silicone composition comprises:
(A) an organopolysiloxane having at least two silicon atom-bonded alkenyl groups and at least one silicon atom-bonded aryl group in a molecule;
(B) an organopolysiloxane having at least two silicon atom-bonded hydrogen atoms in a molecule, in an amount such that a content of the silicon atom-bonded hydrogen atoms contained in this component is from about 0.1 to about 10 mole(s) relative to 1 mole of the alkenyl groups contained in component (A);
(C) the cadmium-free quantum dot, in an amount of from about 0.01 to about 10 mass % of the composition; and
(D) a hydrosilylation reaction catalyst, in an amount that accelerates curing of the composition.

In certain embodiments, the curable silicone composition further comprises (E) a hydrosilylation reaction inhibitor, in an amount of from about 0.01 to about 3 part(s) by mass per 100 parts by mass of the total amount of components (A) and (B).

The curable silicone composition may be an adhesive, sealing agent, or a coating agent for an electric/electronic device.

The cured product of the present invention is produced by curing the curable silicone composition described above.

Effects of Invention

The curable silicone composition of the present invention exhibits excellent dispersibility of a quantum dot and cures to form a cured product exhibiting excellent color conversion efficiency. Furthermore, the cured product of the present invention exhibits excellent dispersibility of a quantum dot and exhibiting excellent color conversion efficiency.

DETAILED DESCRIPTION OF THE INVENTION

The terms "comprising" or "comprise" are used herein in their broadest sense to mean and encompass the notions of "including," "include," "consist(ing) essentially of," and "consist(ing) of. The use of "for example," "e.g.," "such as," and "including" to list illustrative examples does not limit to only the listed examples. Thus, "for example" or "such as" means "for example, but not limited to" or "such as, but not limited to" and encompasses other similar or equivalent examples. The term "about" as used herein serves to reasonably encompass or describe minor variations in numerical values measured by instrumental analysis or as a result of sample handling. Such minor variations may be in the order of ±0-25, ±0-10, ±0-5, or ±0-2.5, % of the numerical values. Further, The term "about" applies to both numerical values when associated with a range of values. Moreover, the term "about" may apply to numerical values even when not explicitly stated.

Generally, as used herein a hyphen "-" or dash "-" in a range of values is "to" or "through"; a ">" is "above" or "greater-than"; a "≥" is "at least" or "greater-than or equal to"; a "<" is "below" or "less-than"; and a "≤" is "at most" or "less-than or equal to." On an individual basis, each of the aforementioned applications for patent, patents, and/or patent application publications, is expressly incorporated herein by reference in its entirety in one or more non-limiting embodiments.

It is to be understood that the appended claims are not limited to express and particular compounds, compositions, or methods described in the detailed description, which may vary between particular embodiments which fall within the scope of the appended claims. With respect to any Markush groups relied upon herein for describing particular features or aspects of various embodiments, it is to be appreciated that different, special, and/or unexpected results may be obtained from each member of the respective Markush group independent from all other Markush members. Each member of a Markush group may be relied upon individually and or in combination and provides adequate support for specific embodiments within the scope of the appended claims.

It is also to be understood that any ranges and subranges relied upon in describing various embodiments of the present invention independently and collectively fall within the scope of the appended claims, and are understood to describe and contemplate all ranges including whole and/or fractional values therein, even if such values are not expressly written herein. One of skill in the art readily recognizes that the enumerated ranges and subranges sufficiently describe and enable various embodiments of the present invention, and such ranges and subranges may be further delineated into relevant halves, thirds, quarters, fifths, and so on. As just one example, a range "of from 0.1 to 0.9" may be further delineated into a lower third, i.e., from 0.1 to 0.3, a middle third, i.e., from 0.4 to 0.6, and an upper third, i.e., from 0.7 to 0.9, which individually and collectively are within the scope of the appended claims, and may be relied upon individually and/or collectively and provide adequate support for specific embodiments within the scope of the appended claims. In addition, with respect to the language which defines or modifies a range, such as "at least," "greater than," "less than," "no more than," and the like, it is to be understood that such language includes subranges and/or an upper or lower limit. As another example, a range of "at least 10" inherently includes a subrange of from at least 10 to 35, a subrange of from at least 10 to 25, a subrange of from 25 to 35, and so on, and each subrange may be relied upon individually and/or collectively and provides adequate support for specific embodiments within the scope of the appended claims. Finally, an individual number within a disclosed range may be relied upon and provides adequate support for specific embodiments within the scope of the appended claims. For example, a range "of from 1 to 9" includes various individual integers, such as 3, as well as individual numbers including a decimal point (or fraction), such as 4.1, which may be relied upon and provide adequate support for specific embodiments within the scope of the appended claims.

<Curable Silicone Composition>

First, the curable silicone composition of the present invention will be described in detail. In various embodiments, the curable silicone composition comprises a cadmium-free quantum dot in an amount of from about 0.01 to about 10 mass % of the composition.

The cadmium-free quantum dot is not limited. In various embodiments, the quantum dot includes at least one semiconductor material, e.g., ZnS, ZnSe, InP, GaN, etc. Certain semiconductor materials may have relatively low quantum efficiencies because of non-radiative electron-hole recombination that occurs at defects and dangling bonds at the surface of the nanoparticles. In order to at least partially address these issues, the nanoparticle cores may be at least partially coated with one or more layers (also referred to herein as "shells") of a material different than that of the core, for example a different semiconductor material than that of the "core." The material included in the, or each, shell may incorporate ions from any one or more of groups 2 to 16 of the periodic table. When a nanoparticle has two or more shells, each shell may be formed of a different material. In an exemplary core/shell material, the core is formed from one of the materials specified above and the shell includes a semiconductor material of larger band-gap energy and similar lattice dimensions as the core material. Exemplary shell materials include, but are not limited to, ZnS, ZnO, MgS, MgSe, MgTe and GaN. An exemplary multi-shell nanoparticle is InP/ZnS/ZnO and Zn—Cu—In—S. The confinement of charge carriers within the core and away from surface states provides nanoparticles of greater stability and higher quantum yield.

While the disclosed methods are not limited to any particular nanoparticle material, an advantage of the disclosed methods is that the methods can be used to modify the surface of cadmium-free quantum dots, that is, nanoparticles comprising materials that do not contain cadmium. It has been found that it is particularly difficult to modify the surface of cadmium-free quantum dots. Cadmium-free quantum dots readily degrade when prior art methods, such as prior art ligand exchange methods, are used to modify the surface of such cadmium-free quantum dots. For example, attempts to modify the surface of cadmium-free nanoparticles have been observed to cause a significant decrease in the luminescence quantum yield (QY) of such nanoparticles. The disclosed methods, on the other hand, provide surface-modified cadmium-free nanoparticles with high QY. For example, the disclosed methods have resulted in cadmium-free nanoparticles that are dispersible in water and which have QY greater than about 20%, optionally greater than about 25%, optionally greater than about 30%, optionally greater than about 35%, and optionally greater than about 40%. Examples of cadmium free nanoparticles include nanoparticles comprising semiconductor materials, e.g., ZnS, ZnSe, ZnTe, InP, InAs, InSb, AlP, $Al_2S_3$, AlAs, AlSb, GaN, GaP, GaAs, GaSb, PbS, PbSe, Si, Ge, and particularly, nanoparticles comprising cores of one of these materials and one or more shells of another of these materials.

Suitable cadmium-free quantum dots are commercially available, such as PL-QD-CF-Kit10, PL-QD-CF-Kit25, and PL-QD-CF-Kit100 produced by PlasmaChem GmbH; Streptavidine Cd-free Quantum Dots produced by Ocean NanoTech Company; and CFQD® Quantum Dots produced by Nanoco Technologies Ltd.

In various embodiments, the amount of the cadmium-free quantum dot is in an amount of from about 0.01 to about 10 mass %, optionally of from about 0.01 to about 5 mass %, or optionally of from about 0.05 to about 5 mass %, of the composition. It is thought that when the content of the quantum dot is not less than the lower limit of the range described above, the resulting cured product has excellent color conversion efficiency, and on the other hand, when the content of the quantum dot is not greater than the upper limit of the range described above, the resulting curable silicone composition has good handleability.

In various embodiments, the curable silicone composition can be cured by a hydrosilylation reaction and has at least about 10 mol % of aryl groups in all silicon atom-bonded organic groups.

In certain embodiments, such a curable silicone composition may comprise:
(A) an organopolysiloxane having at least two silicon atom-bonded alkenyl groups and at least one silicon atom-bonded aryl group in a molecule;
(B) an organopolysiloxane having at least two silicon atom-bonded hydrogen atoms in a molecule, in an amount such that a content of the silicon atom-bonded hydrogen atoms contained in this component is from about 0.1 to about 10 mole(s) relative to 1 mole of the alkenyl groups contained in component (A);
(C) the cadmium-free quantum dot, in an amount of from about 0.01 to about 10 mass % of the composition; and
(D) a hydrosilylation reaction catalyst, in an amount that accelerates curing of the composition.

Component (A) is an organopolysiloxane having at least two silicon atom-bonded alkenyl groups and at least one silicon atom-bonded aryl group in a molecule. Examples of the molecular structure of component (A) include straight chain, partially branched straight chain, branched chain, cyclic, and dendritic structures. In certain embodiments, the molecular structure of component (A) is selected from straight chain, partially branched straight chain, and dendritic structures.

Examples of the alkenyl groups include alkenyl groups having from 2 to 12 carbons such as vinyl groups, allyl groups, butenyl groups, pentenyl groups, hexenyl groups, heptenyl groups, octenyl groups, nonenyl groups, decenyl groups, undecenyl group, and dodecenyl groups. The bonding positions of the alkenyl groups in component (A) are not particularly limited, and examples thereof include a molecular terminal(s) and/or side chain(s) of the molecule.

In component (A), silicon atom-bonded organic groups other than the alkenyl groups are not limited, and may be exemplified by alkyl groups having from 1 to 12 carbons, aryl groups having from 6 to 20 carbons, aralkyl groups having from 7 to 20 carbons, and the groups in which some or all of the hydrogen atoms bonded in these groups are substituted with halogen atoms, such as a chlorine atom and bromine atom. Examples of the silicon atom-bonded organic groups include alkyl groups such as methyl groups, ethyl groups, propyl groups, butyl groups, pentyl groups, hexyl groups, heptyl groups, octyl groups, nonyl groups, decyl groups, undecyl groups, and dodecyl groups; aryl groups such as phenyl groups, tolyl groups, xylyl groups, naphthyl groups, anthracenyl groups, phenanthryl groups, and pyrenyl groups; aralkyl groups such as benzyl groups, phenethyl groups, naphthylethyl groups, naphthylpropyl groups, anthracenylethyl groups, phenanthrylethyl groups, and pyrenylethyl groups; and halogenated groups such as 3-chloropropyl groups, and 3,3,3-trifluoropropyl groups. In certain embodiments, in a molecule, at least one of the silicon atom-bonded organic groups is an aryl group. In further embodiments, in a molecule, at least one of the silicon atom-bonded organic groups is a phenyl group. In these embodiments, the content of aryl groups is at least about 10 mol % of all silicon atom-bonded organic groups in the composition.

Component (B) is an organopolysiloxane having at least two silicon atom-bonded hydrogen atoms in a molecule. Examples of the molecular structure of component (B) include straight chain, partially branched straight chain, branched chain, cyclic, and dendritic structures. In certain embodiments, the molecular structure of component (B) is selected from straight chain, partially branched straight chain, and dendritic structures. The bonding positions of the silicon atom-bonded hydrogen atoms in component (B) are not particularly limited, and examples thereof include a molecular terminal(s) and/or side chain(s) of the molecule. Furthermore, examples of groups bonding to silicon atoms, excluding hydrogen atom, in component (B) include alkyl groups, such as a methyl group, ethyl group, propyl group, butyl group, pentyl group, hexyl group, heptyl group, octyl group, nonyl group, decyl group, undecyl group, and a dodecyl group; aralkyl groups, such as a benzyl group, phenethyl group, naphthylethyl group, naphthylpropyl group, anthracenylethyl group, phenanthrylethyl group, and a pyrenylethyl group; halogenated alkyl groups, such as a chloromethyl group, 3-chloropropyl group, and 3,3,3-trifluoropropyl group; glycidoxyalkyl groups, such as 3-glycidoxypropyl group and 4-glycidoxybutyl group; and epoxycyclohexylalkyl groups, such as 2-(3,4-epoxycyclohexyl) ethyl group and 3-(3,4-epoxycyclohexyl)propyl group.

Examples of component (B) include 1,1,3,3-tetramethyldisiloxane, 1,3,5,7-tetramethylcyclotetrasiloxane, tris(dimethylhydrogensiloxy)methylsilane, tris(dimethylhydrogensiloxy)phenylsilane, 1-(3-glycidoxypropyl)-1,3,5,7-tetramethylcyclotetrasiloxane, 1,5-di(3-glycidoxypropyl)-1,3,5,7-tetramethylcyclotetrasiloxane, 1-(3-glycidoxypropyl)-5-trimethoxysilylethyl-1,3,5,7-tetramethylcyclotetrasiloxane, methylhydrogenpolysiloxane capped at both molecular terminals with trimethylsiloxy groups, dimethylsiloxane-methylhydrogensiloxane copolymers capped at both molecular terminals with trimethylsiloxy groups, dimethylpolysiloxane capped at both molecular terminals with dimethylhydrogensiloxy groups, diphenylpolysiloxane capped at both molecular terminals with dimethylhydrogensiloxy groups, dimethylsiloxane-methylhydrogensiloxane copolymers capped at both molecular terminals with dimethylhydrogensiloxy groups, methylhydrogensiloxane-diphenylsiloxane copolymers capped at both molecular terminals with trimethylsiloxy groups, methylhydrogensiloxane-diphenylsiloxane-dimethylsiloxane copolymers capped at both molecular terminals with trimethylsiloxy groups, hydrolysis condensates of trimethoxysilane, copolymers consisting of $(CH_3)_2HSiO_{1/2}$ units and $SiO_{4/2}$ units, copolymers consisting of $(CH_3)_2HSiO_{1/2}$ units, $SiO_{4/2}$ units, and $(C_6H_5)SiO_{3/2}$ units, and a mixture of at least two types of these.

In various embodiments, the content of component (B) in the present composition is an amount such that the silicon atom-bonded hydrogen atoms contained in component (B) is in a range of from about 0.1 to about 10 mole(s), and optionally in a range of from about 0.5 to about 5 mole(s), per 1 mole of total alkenyl groups contained in component (A). It is thought that when the content of component (B) is not less than the lower limit of the range described above, the resulting composition is cured sufficiently, and on the other hand, when the content is not greater than the upper limit of the range described above, heat resistance of the resulting cured product is enhanced, and reliability of an optical semiconductor device produced using this composition is thus enhanced.

Component (C) is the cadmium-free quantum dot as mentioned above. In various embodiments, the content of component (C) is in a range of from about 0.01 to about 10 mass % of the composition.

Component (D) is a hydrosilylation reaction catalyst used to accelerate curing of the present composition. Examples of component (D) include platinum-based catalysts, rhodium-based catalysts, and palladium-based catalysts. In certain embodiments, component (D) is a platinum-based catalyst. Examples of the platinum-based catalyst include platinum-based compounds, such as platinum fine powder, platinum black, platinum-supporting silica fine powder, platinum-supporting activated carbon, chloroplatinic acid, alcohol solutions of chloroplatinic acid, olefin complexes of platinum, and alkenylsiloxane complexes of platinum.

The content of component (D) in the present composition is an amount that accelerates curing the present composition. In various embodiments, the content of component (D) in the present composition is an amount such that the amount of the metal atoms in this catalyst is in a range of from about 0.01 to about 1,000 ppm by mass. It is thought that when the content of component (D) is not less than the lower limit of the range described above, the resulting composition is cured sufficiently, and on the other hand, when the content of component (D) is not greater than the upper limit of the range described above, the resulting cured product is resistant to discoloration.

The present composition may contain (E) a hydrosilylation reaction inhibitor in order to prolong the usable time at ambient temperature and to enhance storage stability. Examples of component (E) include alkyne alcohols, such as 1-ethynylcyclohexan-1-ol, 2-methyl-3-butyn-2-ol, 3,5-dimethyl-1-hexyn-3-ol, and 2-phenyl-3-butyn-2-ol; enyne compounds, such as 3-methyl-3-penten-1-yne and 3,5-dimethyl-3-hexen-1-yne; methylalkenylsiloxane oligomers, such as 1,3,5,7-tetramethyl-1,3,5,7-tetravinylcyclotetrasiloxane and 1,3,5,7-tetramethyl-1,3,5,7-tetrahexenylcyclotetrasiloxane; alkynoxysilanes, such as dimethyl bis-(3-methyl-1-butyn-3-oxy)silane and methylvinyl bis-(3-methyl-1-butyn-3-oxy) silane; and triallylisocyanurate-based compounds.

The content of component (E) is not particularly limited. In various embodiments, the content is in a range of from about 0.01 to about 3 part(s) by mass, or optionally in a range of from about 0.01 to about 1 part(s) by mass, per 100 parts by mass of the total amount of components (A) to (C). It is thought that when the content of component (E) is not less than the lower limit of the range described above, suitable usable life of the present composition is ensured, and on the other hand, when the content is not greater than the upper limit of the range described above, suitable workability of the present composition is ensured.

In various embodiments, the present composition may contain a phosphor in order to convert the emission wavelength from an optical semiconductor element. Examples of the phosphor include substances widely used in light emitting diodes (LEDs), such as yellow, red, green, and blue light-emitting phosphors, such as oxide-based phosphors, oxynitride-based phosphors, nitride-based phosphors, sulfide-based phosphors, and oxysulfide-based phosphors. Examples of oxide-based phosphors include yttrium, aluminum, and garnet-type YAG green to yellow light-emitting phosphors containing cerium ions; terbium, aluminum, and garnet-type TAG yellow light-emitting phosphors containing cerium ions; and silicate green to yellow light-emitting phosphors containing cerium or europium ions. Examples of oxynitride-based phosphors include silicon, aluminum, oxygen, and nitrogen-type SiAlON red to green light-emitting phosphors containing europium ions. Examples of nitride-based phosphors include calcium, strontium, aluminum, silicon, and nitrogen-type CASN red light-emitting phosphors containing europium ions. Examples of sulfide-based phosphors include ZnS green light-emitting phosphors containing copper ions or aluminum ions. Examples of oxysulfide-based phosphors include $Y_2O_2S$ red light-emitting phosphors containing europium ions. Two or more types of these phosphors may be combined for use.

The average particle diameter of the phosphor is not particularly limited. In various embodiments, the average particle diameter is in a range of from about 1 to about 50 μm, or optionally in a range of from about 5 to about 20 μm. It is thought that when the average particle diameter of the phosphor is not less than the lower limit of the range described above, increase in viscosity upon mixing is suppressed, and on the other hand, when the average particle diameter is not greater than the upper limit of the range described above, excellent light transmittance is achieved.

In various embodiments, the content of the phosphor is in a range of from about 0.1 to about 70% by mass, optionally in a range of from about 1 to about 70% by mass, or optionally in a range of from about 5 to about 70% by mass, relative to the total amount of the composition.

The cured product of the present invention will now be described in detail. The cured product of the present invention is formed by curing the curable silicone composition described above. The shape of the cured product is not particularly limited, and examples include a sheet shape and a film shape. Furthermore, this cured product may be in the form of sealing or coating an optical semiconductor element or the like.

Examples

The following examples, illustrating the curable silicone composition and the cured product, are intended to illustrate and not limit the present invention. In the formulae, Me, Vi, and Ph represent a methyl group, vinyl group, and phenyl group, respectively. Furthermore, the characteristics of the curable silicone composition and the cured product thereof were measured as follows, and the results are shown in Table 1.

<Dispersibility of Quantum Dot (QD)>

Condition of dispersion of the quantum dot in the obtained curable silicone composition was visually observed and result thereof was evaluated as follows.
- o: Quantum dot is uniformly dispersed
- Δ: Quantum dot is partially aggregated
- x: Quantum dot is mostly aggregated <Relative Color Conversion Efficiency>

The color conversion efficiency was defined as relative photoluminescence quantum yield (PLQY), where PLQY was defined as:

$$PLQY = \frac{\text{Number of Photons emitted as photoluminescence from sample}}{\text{Number of photons absorbed by sample}}$$

The basic measurement method was almost identical with commercialized Hamamatsu C11347-11 Quantaurus-QY Absolute PL quantum yield spectrometer excluding excitation light source. For this testing, QD was excited by blue light source instead of UV lamp.

Relative color conversion efficiency was relative value when setting color conversion efficiency of Comparative Example 1 to 100%.

Practical Examples 1 to 3 and Comparative Examples 1 to 2

The following components were mixed in the compositions (part by mass) shown in Table 1 to prepare curable silicone compositions. Note that the "SiH/Vi" values in the Table 1 refer to the number of moles of silicon atom-bonded hydrogen atoms contained in components corresponding to component (B), relative to 1 mole of vinyl groups contained in components corresponding to component (A). Furthermore, the content of component (D) is expressed in terms of the content (ppm by mass) of platinum metal relative to the content of the curable silicone composition, and the content of component (E) is expressed in terms of the content (ppm by mass) relative to the content of the curable silicone composition.

The following components were used as component (A).

Component (A-1): a dimethylpolysiloxane represented by the following formula:

ViMe$_2$SiO(Me$_2$SiO)$_{160}$SiMe$_2$Vi

Component (A-2): a dimethylpolysiloxane represented by the following formula:

ViPh$_2$SiO(Me$_2$SiO)$_{12}$SiPh$_2$Vi

Component (A-3): a dimethylsiloxane-diphenylsiloxane copolymer represented by the following formula:

ViMe$_2$SiO(Me$_2$SiO)$_{200}$(Ph$_2$SiO)$_{50}$SiMe$_2$Vi

Component (A-4): a methylphenylpolysiloxane represented by the following formula:

ViMe$_2$SiO(MePhSiO)$_{25}$SiMe$_2$Vi

The following components were used as component (B).

Component (B-1): an organotrisiloxane represented by the formula:

HMe$_2$SiOPh$_2$SiOSiMe$_2$H

Component (B-2): an organopolysiloxane represented by the average unit formula:

(HMe$_2$SiO$_{1/2}$)$_{0.6}$(PhSiO$_{3/2}$)$_{0.4}$

Component (B-3): a methylhydrogenpolysiloxane represented by the formula:

Me$_3$SiO(MeHSiO)$_{50}$SiMe$_3$

The following component was used as component (C).

Component (C-1): Cadmium-free hydrophobic Zn—Cu—In—S/ZnS quantum dot (PL-QD-CF-Kit100 produced by PlasmaChem)

The following component was used as component (D).

Component (D-1): solution of a platinum-1,3-divinyl-1,1,3,3-tetramethyldisiloxane complex in 1,3,5,7-tetramethyl-1,3,5,7-tetravinylcyclotetrasiloxane (the solution contains 0.12% by mass of platinum)

The following component was used as component (E).

Component (E-1): 1-ethynylcyclohexan-1-ol

TABLE 1

| | | | Practical Examples | | | Comparative Examples | |
|---|---|---|---|---|---|---|---|
| Item | | | 1 | 2 | 3 | 1 | 2 |
| Curable silicone composition (parts by mass) | (A) | (A-1) | — | — | — | 98.00 | 45.67 |
| | | (A-2) | 43.50 | — | — | — | 45.67 |
| | | (A-3) | 43.50 | 97.67 | — | — | — |
| | | (A-4) | — | — | 91.33 | — | — |
| | (B) | (B-1) | 11.7 | 2.10 | 7.80 | — | — |
| | | (B-2) | 1.30 | 0.23 | 0.87 | — | — |
| | | (B-3) | — | — | — | 2.00 | 8.66 |
| | (C) | (C-1) | 0.2 | 0.2 | 0.2 | 0.2 | 0.2 |
| | (D) | (D-1) | | 200 ppm * | | | |
| | (E) | (E-1) | | 3,000 ppm * | | | |
| SiH/Vi | | | 1.1 | 1.1 | 1.1 | 1.1 | 1.1 |
| Aryl content (mol %) | | | 17.9 | 19.6 | 42.2 | 0 | 5.9 |
| Dispersibility of QD | | | o | o | o | x | Δ |
| Relative color conversion efficiency (%) | | | 122 | 143 | 137 | 100 | 106 |

As is clear from the results in Table 1, it was found that the cured product of the curable silicone compositions prepared in Practical Examples 1 to 3 exhibited excellent color conversion efficiency because of superior dispersibility of quantum dot compared to those of the curable silicone compositions prepared in Comparative Examples 1 to 2.

INDUSTRIAL APPLICABILITY

The curable silicone composition of the present invention exhibits excellent dispersibility of a cadmium-free quantum dot, and cures to form a cured product exhibiting excellent color conversion efficiency. Therefore, the curable silicone composition of the present invention is suitable as sealing agents, protective coating agents, and the like of optical semiconductor elements in optical semiconductor devices, such as light emitting diodes (LEDs).

The present invention has been described herein in an illustrative manner, and it is to be understood that the terminology which has been used is intended to be in the nature of words of description rather than of limitation. Many modifications and variations of the present invention are possible in light of the above teachings. The present invention may be practiced otherwise than as specifically described within the scope of the appended claims. The subject matter of all combinations of independent and dependent claims, both single and multiple dependent, is herein expressly contemplated.

What is claimed is:

1. A curable silicone composition comprising a cadmium-free quantum dot in an amount of from about 0.01 to about 10 mass % of the composition, wherein the composition can be cured by a hydrosilylation reaction and has at least about 10 mol % of aryl groups in all silicon atom-bonded organic groups;
   wherein the quantum dot comprises a core of at least one material selected from the group consising of ZnS, ZnSe, ZnTe, InAs, InSb, AlP, $Al_2S_3$, AlAs, AlSb, GaN, GaP, GaAs, GaSb, PbS, PbSe, Si, or Ge; and one or more shells of at least one another material selected from the group consisting of ZnO, MgS, MgSe, MgTe, or Gan.

2. The curable silicone composition according to claim 1, comprising:
   (A) an organopolysiloxane having at least two silicon atom-bonded alkenyl groups and at least one silicon atom-bonded aryl group in a molecule;
   (B) an organopolysiloxane having at least two silicon atom-bonded hydrogen atoms in a molecule, in an amount such that a content of the silicon atom-bonded hydrogen atoms contained in this component is from about 0.1 to about 10 mole(s) relative to 1 mole of the alkenyl groups contained in component (A);
   (C) the cadmium-free quantum dot, in an amount of from about 0.01 to about 10 mass % of the composition; and
   (D) a hydrosilylation reaction catalyst, in an amount that accelerates curing of the composition.

3. The curable silicone composition according to claim 2, further comprising (E) a hydrosilylation reaction inhibitor.

4. The curable silicone composition according to claim 3, wherein component (E) is present in an amount of from about 0.01 to about 3 part(s) by mass per 100 parts by mass of the total amount of components (A) and (B).

5. The curable silicone composition according to claim 1, wherein the composition is an adhesive, sealing agent, or a coating agent for an electric/electronic device.

6. A cured product produced by curing the curable silicone composition according to claim 1.

* * * * *